(12) United States Patent
Weiner et al.

(10) Patent No.: US 7,900,163 B2
(45) Date of Patent: Mar. 1, 2011

(54) METHOD AND APPARATUS FOR IDENTIFYING REDUNDANT SCAN ELEMENTS

(75) Inventors: Michael Weiner, Nes-Ziona (IL); Haggai Telem, Moshav Lachish (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 415 days.

(21) Appl. No.: 12/018,410

(22) Filed: Jan. 23, 2008

(65) Prior Publication Data

US 2008/0201669 A1    Aug. 21, 2008

Related U.S. Application Data

(60) Provisional application No. 60/890,918, filed on Feb. 21, 2007.

(51) Int. Cl.
*G06F 17/50* (2006.01)
(52) U.S. Cl. .................. 716/2; 716/4; 716/5; 716/6; 714/724; 714/726; 714/727; 714/729
(58) Field of Classification Search .............. 716/2, 716/4, 5, 6; 714/724, 726, 727, 729; 702/108
See application file for complete search history.

(56) References Cited

U.S. PATENT DOCUMENTS

| 6,067,650 A * | 5/2000 | Beausang et al. ........... 714/726 |
| 6,463,561 B1 * | 10/2002 | Bhawmik et al. ........... 714/733 |
| 6,651,197 B1 * | 11/2003 | Wildes et al. ............... 714/726 |
| 2007/0260949 A1 * | 11/2007 | Fredrickson et al. ........ 714/726 |

* cited by examiner

*Primary Examiner* — Paul Dinh
*Assistant Examiner* — Nha T Nguyen

(57) ABSTRACT

An approach for producing optimized integrated circuit designs that support sequential flow partial scan testing may be embedded within an integrated circuit electronic design device. Using the approach, an integrated circuit design may be analyzed to identify and remove scan-enabled memory elements, or scan elements, that are redundant. The redundant scan elements may be replaced with memory elements that do not support scan testing. Once the redundant scan elements are removed, the integrated circuit design my be optimized using automated techniques to reduce the area of the integrated circuit physical layout and to simplify/minimize routing connections between remaining features within the integrated circuit design. The described approach may achieve a reduced total area layout and complexity, an improved time/frequency response, and/or reduced power consumption and/or heat generation within the circuit design, without reducing the fault coverage achieve during testing.

18 Claims, 9 Drawing Sheets

METHOD AND APPARATUS FOR IDENTIFYING REDUNDANT SCAN ELEMENTS

INCORPORATION BY REFERENCE

This application claims the benefit of U.S. Provisional Application No. 60/890,918, "Identify Redundant Scan Elements" filed by Michael Weiner and Haggai Telem on Feb. 21, 2007, which is incorporated in its entirety by reference herein.

BACKGROUND

A digital integrated circuit design intended for mass-production may be modified to include testing capabilities. For example, integrated circuit designers may incorporate circuit components within an integrated circuit design that facilitate testing of an integrated circuit chip. Such components, embedded within a produced circuit, in conjunction with an automatic test pattern generator, may allow a chip that is produced based on the integrated circuit design to be tested before being packaged within a final product. One testing technique used in the integrated circuit industry is referred to as a scan, or scan testing. The scan testing technique may include loading and unloading data to/from respective memory elements in an integrated circuit through external leads. For example, test data may be loaded, or shifted in, to memory elements, e.g. flip-flops, within an integrated circuit via one or more scan test chains in preparation for conducting a test of combinational logic within the integrated circuit. Once the test input data is shifted in, combinational logic within the integrated circuit may be executed for one or more cycles to generate test output data that is stored within memory elements, e.g. flip-flops, of the one or more scan test chains. The resulting test output data may then be unloaded, or shifted out, via the one or more scan chains. A load/unload process may be referred to as a scan-shift flow. A scan-shift flow with a single capture is called a combinational flow and flow with a repeating capture event may be called a sequential flow. All capture events except for the last capture in a sequential flow may be called launch events and the last capture event may be called a capture.

An integrated circuit design tool may support simulated testing of an integrated circuit design that supports scan testing. Such an integrated circuit design tool may generate a fault coverage, typically a number between 90% and 99%, that refers to the percentage of possible faults that the design tool determines would be detected during the testing of an actual integrated circuit chip. Adapting a circuit to support scan chain testing may significantly increase the complexity of the circuit by requiring, for example, the inclusion of external scan input leads, the inclusion of external scan output leads, the inclusion of a scan enable lead, the inclusion of a scan control element, e.g., a multiplexor, for each flip-flop, and the routing of additional control lead and data lead connections. Such additional components and leads adversely affect, i.e., increase, the area, routing, power consumption and heat dissipation requirements of the circuit. Further, such additional features may increase the minimum clock cycle time, thereby decreasing the maximum frequency that may be achieved by the circuit.

In a full scan design, all memory elements, e.g., flip-flops, used to store input data to, and output data from, combinational logic within an integrated circuit, may be converted to scan-enabled memory elements e.g., multiplexed flip-flops connected in a scan chain that supports scan chain testing. In a partial scan design, only a selected portion of the memory elements may be converted to scan-enabled memory elements. For designs that are sensitive to area and/or performance overhead, a test approach using a sequential flow and a partial scan offers an attractive alternative to the full-scan test approach. By reducing the number of scan-enabled memory elements using a partial scan approach, the adverse impact on circuit performance, addressed above, may be reduced. However, reducing the number of scan-enabled memory elements also reduces the fault coverage that is achieved. Therefore, a significant issue faced by integrated circuit designers is how to reduce the number of scan-enabled memory devices included in an integrated circuit design, without reducing the fault coverage achieved with the subsequent partial scan testing.

SUMMARY

Any portion of an integrated circuit that receives a set of binary data values, processes the received data with combinational logic and transmits a set of output values may be referred to as a processing path. The physical characteristics of a processing path may vary depending on the complexity of the processing path. For example, a complex processing path with a greater number of components and routed electrical connections may require more processing time, require more power, generate more heat, and have a larger physical footprint that a less complex processing path with fewer components.

In accordance with the described circuit optimization approach, scan-enabled memory elements, or scan elements, may be inserted within an integrated circuit design. Processing paths within the modified integrated circuit design, i.e., processing paths that exceed a predetermined feature threshold with respect to one or more of power consumption, heat dissipation, layout area, routing area, processing time delay, operating frequency and/or other quantifiable circuit characteristic, may be selected. The selected processing paths may then be analyzed to identify and to remove redundant scan elements, i.e., scan elements that may be replaced with memory elements that do not support scan testing without reducing the fault coverage in excess of a predetermined fault coverage reduction threshold. Once the redundant scan elements are removed, the processing path, and/or the integrated circuit design as a whole, may be optimized using automated techniques with respect to one or more circuit characteristics. The conversion of redundant scan elements and subsequent optimization may be repeated, e.g., performed iteratively or recursively, to build a design and layout configuration that optimizes multiple parameters, e.g., to optimize both the number of scan elements included within the design as well as other optimizations of parameters of interest. The described approach may achieve a reduced total area layout and complexity, an improved time/frequency response, and/or reduced power consumption and/or heat generation within the circuit design, without reducing the fault coverage achieved by the circuit below a predetermined threshold value.

An example of a first embodiment may be a method of configuring an integrated circuit design to support sequential flow partial scan testing. The method may include providing a plurality of memory elements in the integrated circuit design that are scannable memory elements, the integrated circuit design having a specified scan coverage, identifying at least one of the scannable memory elements using a selection criteria as a redundant scan element that does not alter the scan coverage in excess of a fault coverage reduction threshold, converting the identified redundant scan elements to memory elements that are not scannable in a revised integrated circuit design and optimizing a parameter of the revised integrated circuit design.

An example of a second embodiment may be an integrated circuit electronic design device that may include an insertion unit that provides a plurality of memory elements in the integrated circuit design that are scannable memory elements, the integrated circuit design having a specified scan coverage. The integrated circuit electronic design device may further include a redundancy unit that identifies at least one of the scannable memory elements using a selection criteria as being a redundant scan element that does not reduce the scan coverage in excess of a fault coverage reduction threshold, a conversion unit that converts the identified redundant scannable memory elements to memory elements that are not scannable in a revised integrated circuit design and one or more optimizer units that optimize a parameter of the revised integrated circuit design.

An example of a third embodiment may be an integrated circuit manufactured from an integrated circuit design produced using an integrated circuit electronic design device. The integrated circuit electronic design device may include an insertion unit that provides a plurality of memory elements in the integrated circuit design that are scannable memory elements, in which the integrated circuit design has a specified scan coverage, a redundancy unit that identifies at least one of the scannable memory elements using a selection criteria as being a redundant scan element that does not alter the scan coverage in excess of a fault coverage reduction threshold, a conversion unit that converts the identified redundant scannable memory elements to memory elements that are not scannable in a revised integrated circuit design and one or more optimizer units that optimize a parameter of the revised integrated circuit design.

An example of a fourth embodiment may be an integrated circuit electronic design device, that may include a processing path selection unit that selects a processing path associated with the integrated circuit design. The integrated circuit electronic design device may further include a fault coverage unit that determines a first fault coverage for the selected processing path and determines a second fault coverage for the selected processing path assuming that a selected scan element within the selected processing path is converted to a non-scannable memory element and a verification unit that compares the determined first fault coverage to the determined second fault coverage to generate a fault coverage difference. The integrated circuit electronic design device may disallow conversion of the selected scannable memory element to a non-scannable memory element if a difference between the first fault coverage and the second fault coverage exceeds an allowed fault coverage reduction threshold.

An example of a fifth embodiment may be a method for controlling a change to an integrated circuit design. The method may include selecting a processing path within an integrated circuit design, determining a first fault coverage for the selected processing path, determining a second fault coverage for the selected processing path assuming that a selected scannable memory element within the selected processing path is converted to a non-scannable memory element and disallowing conversion of the selected scannable memory element to a non-scannable memory element if a difference between the first fault coverage and the second fault coverage exceeds an allowed fault coverage reduction threshold.

BRIEF DESCRIPTION OF THE DRAWINGS

Examples of embodiments of a method and apparatus for configuring an integrated circuit design to support sequential flow partial scan testing using scan element optimization approaches will be described with reference to the following drawings, wherein like numerals designate like elements, and wherein.

DETAILED DESCRIPTION OF EMBODIMENTS

Figure 1:
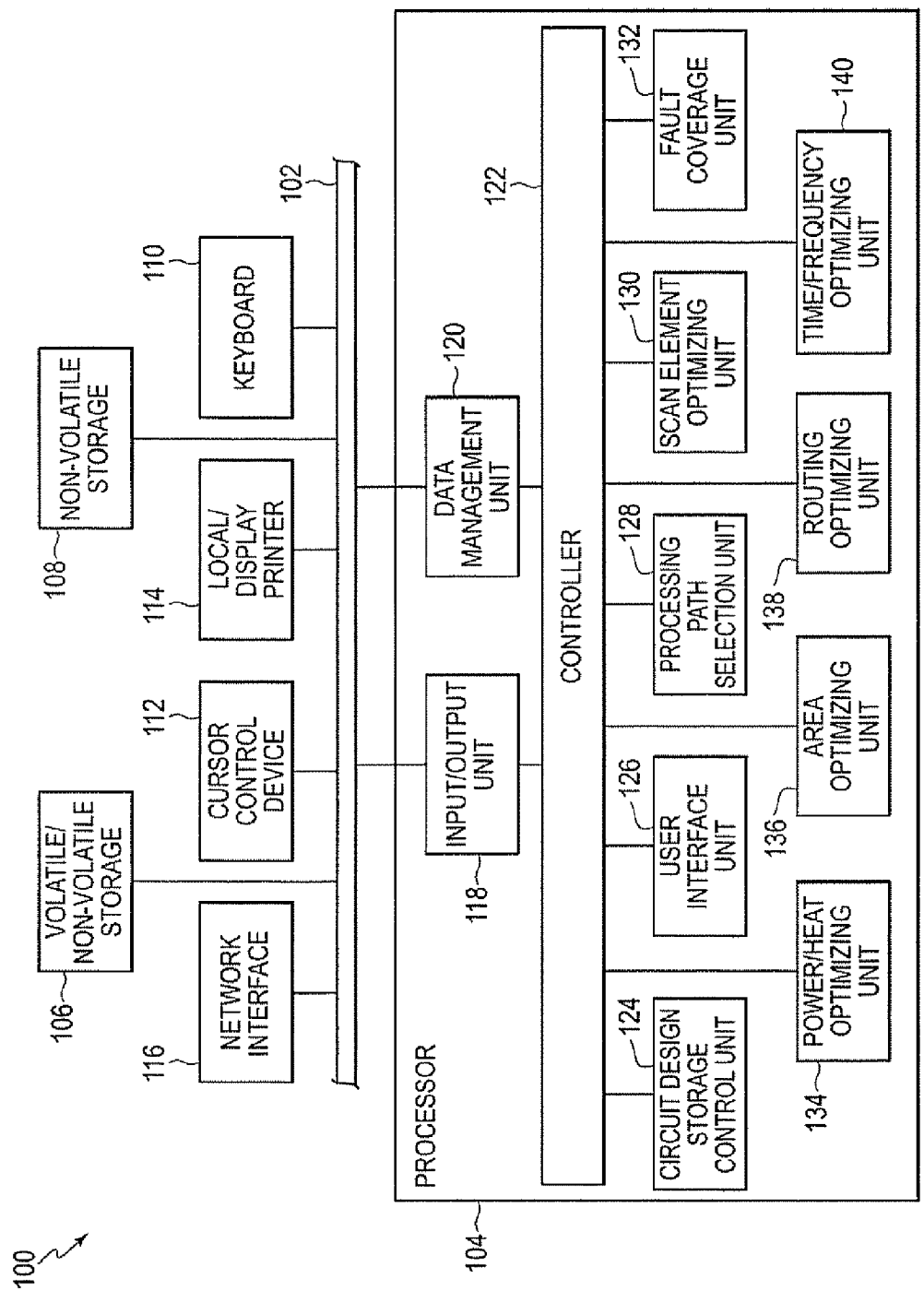
FIG. 1 is a system level block diagram of an example of an integrated circuit (IC) electronic design device that supports the described scan element optimization approach.

The maximum frequency of an integrated circuit may be determined by the minimum duration between clock cycles. The minimum duration between clock cycles may be determined by the speed with which the respective integrated circuit components can respond to an activating clock pulse and perform their respective processing functions. For example, the maximum frequency of a circuit may be determined by the actual circuit components, e.g. p-type transistors, n-type transistors, static latches, etc., used to implement the respective schematically represented flip-flops, the logic complexity and circuit components used to implement the respective combinational logic matrices, and the routing of transmitting wires between the respective components. In addition, the maximum frequency may be affected by the type of semiconductor technology used, e.g., the physical size and response time characteristics of the semiconductor techniques used.

Further, the physical footprint, or total area, of an integrated circuit may be determined by the number of components required to implement the circuit, the minimum feature sizes that may be achieved with the selected technology, as well as the efficiency with which the circuit is laid out.

The time/frequency characteristics and layout area requirements for an integrated circuit are both affected by routing constraints. For example, a circuit that requires a greater number of control signal lines, and/or a greater number of circuit components may require a greater number of connecting leads to be routed between components. Based on the semiconductor technology used to create the circuit, such connecting leads may have minimum width requirements and/or minimum separation requirements between leads and/or maximum length requirements, etc. Such constraints, in addition to the complexity and layout of the respective circuit functional components may significantly impact the overall layout area requirements of the circuit. Further, each control line has an associated transmission delay that is proportional to the length of the control line. Therefore, the greater the number and length of control lines, the greater the transmission delays associated with the circuit.

In addition, the power consumption requirements and heat dissipation requirements of an integrated circuit are both affected by the complexity of the circuit. For example, a circuit that requires a greater number of transistors and/or other power consuming components may require more power to operate than a similarly constructed circuit with fewer components. Further, the heat dissipation requirements of a circuit may be directly proportional to the circuit's power requirements. A circuit that consumes more power may generate more heat that must be dissipated. Unless the circuit design is capable of dissipating sufficient heat into the surrounding environment, the operating temperature of the circuit may exceed its operational limits, and the circuit may fail. In addition, the resistance of each connecting lead between circuit components may also increase power consumption and heat dissipation requirements of the circuit. Therefore, increasing the complexity of a circuit typically increases the number of power consuming components and the number of connecting leads between components, thus increasing the power consumption requirements and the heat dissipation requirements of the circuit.

FIG. 1 is a system level block diagram of an example of an integrated circuit electronic design device that may be used to generate an integrated circuit design that supports sequential flow partial scan testing. The described integrated circuit electronic design device may be used to identify and to remove scan elements that are redundant, i.e. may be replaced with memory elements that do not support scan testing without reducing the fault coverage in excess of a predetermined fault coverage reduction threshold, from an integrated circuit design that supports sequential flow partial scan testing.

Integrated circuit electronic design device 100, as shown in FIG. 1, may include, a computer system data bus 102 that allows a processor 104 to communicate and exchange information with hardware components of the device such as: volatile/non-volatile memory 106, which allows the processor 104 to store program instructions in local memory for execution and to store and maintain temporary variables necessary for execution of the stored program instructions; nonvolatile storage 108, which allows processor 104 to access and retrieve larger bodies of data and program instructions for later execution by the processor; keyboard 110, and/or a cursor control device 112 that allows the processor to receive user instructions and/or information and/or feedback; network interface 116 which allows processor 104 to communicate with and exchange information with other devices over a LAN/WAN/Internet network as described below; and display/printer 114 which allows processor 104 to format and present feedback and reports to an operator of integrated circuit electronic design device 100.

As further shown in FIG. 1, processor 104 may include internal components that allow the processor to communicate with the above-described hardware components to send and receive data and instructions over system data bus 102. Such components may include: a controller 122 capable of communicating with and controlling an input/output unit 118 that manages communication exchanges via the system data bus 102; and a data management unit 120, which allows the controller 122 to maintain a local set of control parameters such as counters, pointers, and segments of executable program instructions currently under execution.

When provided with executable instructions, controller 122 may, in addition to performing other functions and in accordance with instructions/commands received from a user, retrieve and initiate control parameters/pointers for the execution of program instructions related to generating an integrated circuit that supports a partial scan test approach with high fault coverage with reduced adverse impact on the integrated circuit's design and performance characteristics.

Therefore, at startup, as described above, controller 122 may retrieve and load program instructions from nonvolatile storage 108 into volatile/nonvolatile memory 106 for execution and may maintain control parameters in data management unit 120 for use in controlling the simultaneous and/or sequential execution of the program instructions retrieved for execution. In this manner, processor 104 may establish, based on stored program instructions retrieved for execution from nonvolatile storage 108, such as a hard-drive and/or firmware storage: (1) a circuit design storage control unit 124 that may be used to store and retrieve integrated circuit design information; (2) a user interface unit 126 that may allow a user to build an integrated circuit design and to access services provided by modules within integrated circuit electronic design device 100 to produce a partial scan test integrated circuit which has a selection of scannable elements and that has been optimized for high fault coverage, as well as optimized for low power consumption, low heat dissipation, reduced layout area, optimized routing and reduced time response and/or increased maximum frequency; (3) a processing path selection unit 128 that may analyze an integrated circuit design and may identify and select a processing path associated with the design; (4) a scan element optimizing unit 130 that may analyze a selected processing path design and may identify redundant scan elements that may be converted to non-scannable elements without significantly reducing fault coverage, i.e., the fault coverage after the removal of redundant scan elements remains acceptably close to the fault coverage prior to removal of the redundant scan elements; (5) a fault coverage unit 132 that may analyze a selected processing path design, generate a partial scan test pattern for use in testing the selected processing path design and may determine the fault coverage achieved; (6) a power/heat optimizing unit 134 that may analyze a selected processing path design and automatically adjust the design, for example, by changing aspects of the physical layout, power and other optimizing parameters, to reduce power consumption and heat dissipation; (7) an area optimizing unit 136 may analyze a selected processing path design and automatically adjust the design to improve the efficiency of the layout, and thereby reduce the design layout area; (8) a routing optimizing unit 138 that may analyze a selected processing path design and automatically adjust the design to improve the layout of connections between functional components, and thereby improving routing efficiency (9) a time/frequency optimizing unit 140 that may analyze a selected processing path design and may automatically adjust the design to improve the time/frequency response of the circuit.

Figure 2:
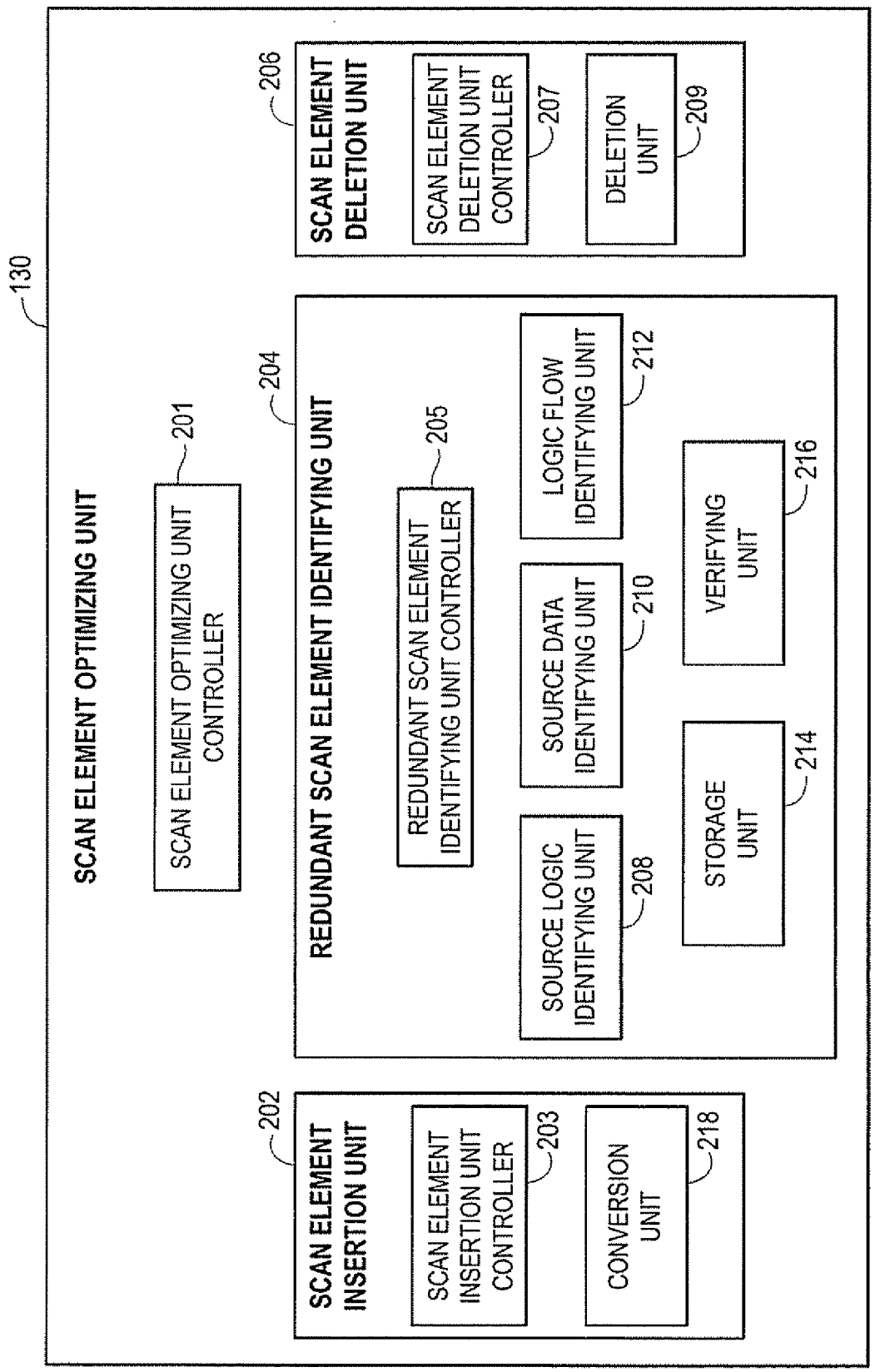
FIG. 2 is a block diagram of an example of a scan element optimizing unit shown in FIG. 1.

FIG. 2 is a block diagram of an example of a scan element optimizing unit shown in FIG. 1 at block 130. As shown in FIG. 2, scan element optimizing unit 130 may include a scan element optimizing unit controller 201, a scan element insertion unit 202, a redundant scan element identifying unit 204, and a scan element deletion unit 206. Scan element optimizing unit 130 may be selectively invoked by controller 122, via communication between control 122 and scan element optimizing unit controller 201, to modify a selected processing path design to support partial scan testing. In response, element optimizing unit controller 201 may coordinate actions performed by scan element insertion unit 202, redundant scan element identifying unit 204, and a scan element deletion unit 206 to implement functions that support the process flow described below with respect to FIG. 4 and FIG. 5, as described in greater detail below.

As shown in FIG. 2, scan element insertion unit 202 may include a scan element insertion unit controller 203 and a conversion unit 218. At the request of scan element optimizing unit controller 201, scan element insertion unit controller 203 may control conversion unit 218 to, for example, convert each of a plurality of memory elements to scan-enabled memory elements, or scan elements, controlled by a common scan enable lead, as described below with respect to FIG. 4 at, for example, step S406 and step S408. Scan elements and scan chains inserted by scan element insertion unit 202 may support a scan-shift operation between scan elements based on a signal received by each scan element via a scan enable lead.

As further shown in FIG. 2, redundant scan element identifying unit 204 may include a redundant scan element identifying unit controller 205, a source logic identifying unit 208, a source data identifying unit 210, a logic flow identifying unit 212, a storage unit 214 and a verifying unit 216. At the request of scan element optimizing unit controller 201, redundant scan element identifying unit controller 205, may coordinate the other units within redundant scan element identifying unit 204 to perform functions as described below in greater detail with respect to FIG. 4 at, for example, step S412 and step S416 and as described below in greater detail with respect to FIG. 5. Specifically, source logic identifying unit 208 may be invoked by redundant scan element identifying unit controller 205 to locate combinational logic in the selected processing path design that controls output to a memory element; source data identifying unit 210 may be invoked to locate circuit components in the selected processing path design that supply input values to the located combinational logic; logic flow identifying unit 212 may be invoked to determine a sequential flow that allows each of a high logic value and a low logic value to be stored in the memory element via the located combinational logic; storage unit 214 may be invoked to store operational constraints related to the sequential flow that allows each of a high logic value and a low logic value to be stored in the memory element via the located combinational logic; and verifying unit 216 may be invoked to verify that the sequential flow used to store either a high logic value and a low logic value to the memory element via the located combinational logic does not reduce a fault coverage below an allowed fault coverage reduction threshold, as described in greater detail below with respect to FIG. 4 at step S405.

As further shown in FIG. 2, scan element deletion unit 206 may include a scan element deletion unit controller 207 and a deletion unit 209. At the request of scan element optimizing unit controller 201, scan element deletion unit controller 207 may control deletion unit 209 to, for example, convert each redundant scan-enabled memory element identified by redundant scan element identifying unit 204 to a non-scannable memory element and reroute component connections, as necessary to remove the memory element from its previously assigned scan chain, as described below with respect to FIG. 4 at, for example, step S416.

In one embodiment, scan element insertion unit 202 may be invoked to insert within a retrieved integrated circuit design, scan-enabled memory elements, or scan elements, to replace memory elements that are not scan-enabled. For example, controller 122 may invoke scan element insertion unit 202 to replace every memory element in an integrated circuit design with a scan element and to connect the scan elements into one or more scan chains. Controller 122 may then invoke redundant scan element identifying unit 204 to identify scan elements that are redundant. Once redundant scan elements are located, controller 122 may invoke scan element deletion unit 206 to remove the redundant scan elements.

As described below with respect to FIG. 4 and FIG. 5, controller 122 may invoke the module units within integrated circuit electronic design device 100 in any order and sequence. For example, in one embodiment, module units within integrated circuit electronic design device 100 may be called in a repeated, e.g., iteratively, or recursively, manner to refine an integrated circuit design until a circuit design is achieved with layout and operational parameters within bounds set by predetermined control parameters supplied, for example, by a user to controller 122 via user interface unit 126.

For example, in one embodiment, after invoking scan element insertion unit 202 to replace memory elements in an integrated circuit design with a scan-enabled memory elements, or scan elements, controller 122 may invoke fault coverage unit 132 to determine an optimal number of scan chains by which to connect the respective scan elements and to determine which scan elements should be included in the one or more scan chains. For example, in determining how many scan chains to form, and in determining which scan elements should be included in the respective scan chains, fault coverage unit 132 may analyze the integrated circuit design and related combinational logic matrices, generate a plurality of potential scan chain configurations and a set of partial scan test patterns based on a plurality of heuristic approaches, for example, and may generate a fault coverage percentage for each of the respective partial scan test patterns. The scan chain/partial scan test pattern combination that produces the highest fault coverage may be selected.

In another embodiment, controller 122 may further invoke area optimizing unit 136 and routing optimization unit 138 to optimize the integrated circuit design component layout and interconnection routing after redundant scan elements have been identified and removed. In such a manner, controller 122 may, for example, generate an integrated circuit capable of supporting partial scan testing of the circuit, which has been optimized, or reconfigured, to conform with area constraints and a minimum fault coverage provided to controller 122 by a user. The conversion of redundant scan elements and subsequent optimization may be performed repeatedly, e.g., iteratively, or recursively, to build a design and layout configuration that optimizes multiple parameters, e.g., to optimize both the number of scan elements included within the design as well as other optimizations parameters of interest, such as those optimization parameters of importance described above.

Figure 3:
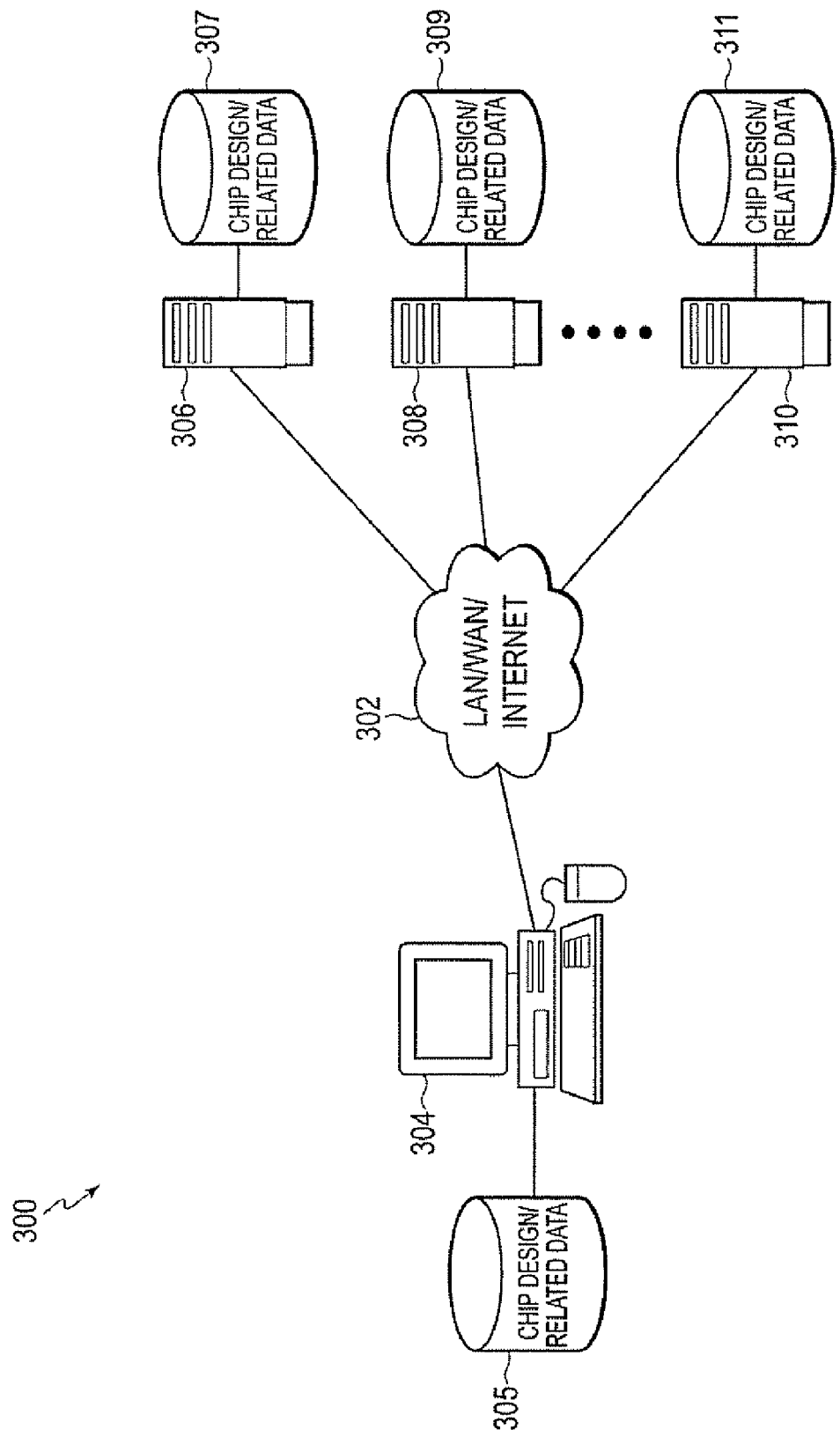
FIG. 3 is a schematic diagram of an example of a network that provides connectivity between a user workstation and processing components of an integrated circuit electronic design device that supports distributed processing.

FIG. 3 is a schematic diagram of an example of a network 300 that provides connectivity between an example of an integrated circuit electronic design device configured as a user workstation 304 with a local integrated circuit design data storage 305, and a plurality of integrated circuit design processing devices configured as service providing servers. For example, wide area and/or internet based network 302 may provide connectivity between a user workstation 304 with a local integrated circuit design data storage 305 with one or more integrated circuit design processing devices configured as service providing servers that may support one or more of the modular units described above with respect to FIG. 1. For example, due to the complexity of the integrated circuit electronic design device 100, one or more of the processing units described above with respect to FIG. 1 may execute on one or more other processing devices that respond to processing and information requests from user workstation 304.

For example, as shown in FIG. 3, integrated circuit electronic design service provider 306 with integrated circuit design data storage 307, integrated circuit electronic design service provider 308 with integrated circuit design data storage 309, and integrated circuit electronic design service provider 310 with integrated circuit design data storage 311, may each conduct service requests for integrated circuit electronic design processing services from user workstation 304 with a local integrated circuit design data storage 305 via LAN, WAN, and/or Internet based network 302.

Figure 4:
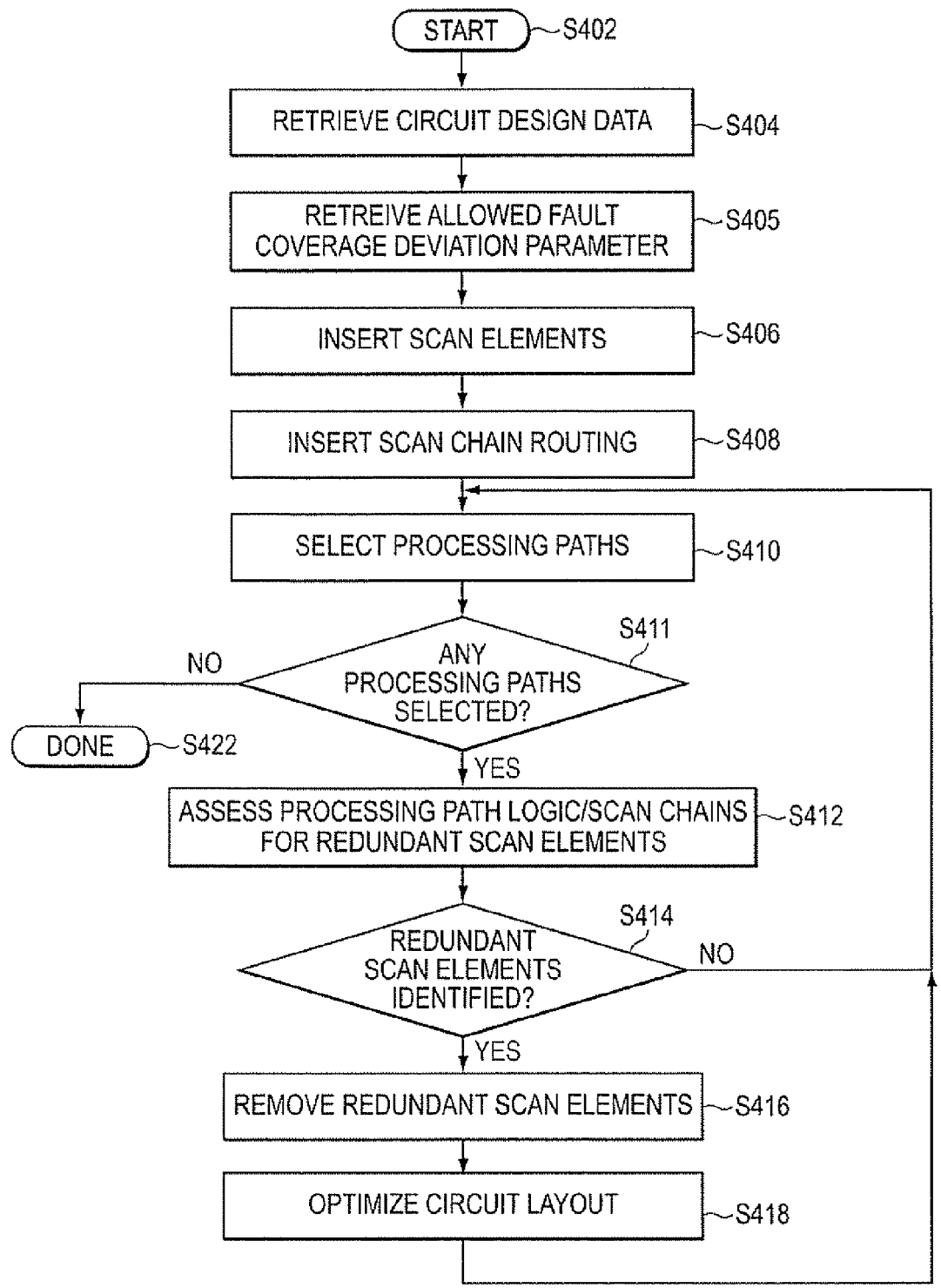
FIG. 4 is a flow diagram representing an example of a method for generating an integrated circuit electronic design with a reduced number of scan elements.

FIG. 4 is a flow diagram representing an example of a method for generating an optimized integrated circuit design with a reduced number of scan elements that achieves a preselected fault coverage. As shown in FIG. 4, operation of the method begins at step S402 and proceeds to step S404.

In step S404, controller 122 may retrieve, via circuit design storage control unit 124, a circuit design, and operation of the method continues to step S805.

In step S405, controller 122 may retrieve, via circuit design storage control unit 124, an allowed fault coverage reduction threshold. The allowed fault coverage reduction threshold may represent an integrated circuit design default or user configurable parameter that represents an allowed reduction in fault coverage, e.g., a percentage reduction in fault coverage, that is acceptable as a result of the elimination of redundant scan elements. For example, as described in greater detail below, if removal of a redundant scan element would result in fault coverage exceeding the allowed fault coverage reduction threshold, the redundant scan element is not converted to a non-scannable memory element, as described below with respect to step S414 and FIG. 5 at step S514. Once the allowed fault coverage reduction threshold is retrieved, operation of the method continues to step S406.

In step S406, controller 122 may invoke scan element optimizing unit 130 and scan element insertion unit 202 to replace memory elements within the circuit design with scan-enabled memory elements, or scan elements, and operation of the method continues to step S408.

In step S408, controller 122 may invoke routing optimization unit 138 to route connections between the newly inserted scan-enabled memory devices to establish one or more scan chains, and operation of the method continues to step S410.

In step S410, controller 122 may invoke processing path selection unit 128 to analyze the scan-enabled circuit design to identify and select a first, or next, set of one or more processing paths. For example, processing path selection unit 128 may invoke time/frequency optimizing unit 140 to identify integrated circuit processing paths with the longest processing delays. However, embodiments of integrated circuit electronic design device 100 may be configured to allow processing path selection unit 128 to invoke any combination of power/heat optimizing unit 134, area optimizing unit 136, routing optimizing unit 138 and time/frequency optimizing unit 140 to identify and select a set of integrated circuit processing paths with one or more of the following allowed predetermined default and/or user supplied feature thresholds: (1) a highest power consumption, or a power consumption that exceeds a predetermined value; (2) a highest heat dissipation, or a heat dissipation that exceeds a predetermined value; (3) a greatest layout area, or a layout area that exceeds a predetermined value; (4) a greatest combined routing area, or a combined routing area that exceeds a predetermined value; (5) a greatest processing time delay, or a processing time delay that exceeds a predetermined value; and (6) a smallest maximum operating frequency, or an operating frequency that falls below a predetermined value, respectively.

In one embodiment, processing path selection unit 128 may include a predetermined, e.g., user defined, priority for each of the above respective circuit characteristics. In determining which of the processing paths to select, processing path selection unit 128 may determine which paths have a higher combined priority, which may be determined by adding the priorities assigned to the respective feature thresholds that each of the respective processing path has exceeded. For example, a single processing path with the highest combined priority may be selected, or the top five processing paths with the highest combined priority may be selected. Once one or more processing paths have been selected based on any combination of the above one or more criteria, operation of the method continues to step S411. In another embodiment, processing path selection unit 128 may include a cost function that may assess a level of improvement achieved in subsequent optimized iterations of the integrated circuit design with respect to, for example, one or more of the above-described feature thresholds. Upon determining that the incremental improvement achieved with respect to one or more of the above-described circuit characteristics, e.g., circuit characteristics for which feature thresholds have been defined, has fallen below a predetermined and/or user specified incremental improvement threshold, the processing path selection unit 128 may determine that further optimization cycles are no longer cost effective and, therefore, the processing path selection unit 128 may decide not to select additional processing paths for optimization.

If in step S411, the controller determines that no processing paths were selected in step S410, operation of the method proceeds to step S422 and the process terminates, otherwise, operation of the method continues to step S412.

In step S412, controller 122 may invoke scan element optimizing unit 130 and redundant scan element identifying unit 204, to assess the selected processing paths for redundant scan elements, e.g., scan-enabled flip-flops, that can be replaced with a memory element that is not scan-enabled without adversely impacting the fault coverage that can be achieved using sequential flow scan testing in conjunction with a selected combination of sequential flow scan test patterns and a selected combination of controlled shift-scan, launch and capture cycles. An example of a process flow that may be executed to assess selected processing paths for redundant scan elements is described below with respect to FIG. 5. Once the circuit design has been processed to identify redundant scan elements, operation of the method continues to step S414.

If, in step 8414, the controller determines that redundant scan elements were identified in step S412, operation of the method continues to step S416, otherwise operation of the method returns to step S410.

In step S416, controller 122 may invoke scan element optimizing unit 130 and scan element deletion unit 206 to remove redundant scan elements identified in step S414 and to replace the redundant scan elements with memory elements that are not scan-enabled, and operation of the method continues to step S418.

In step S418, controller 122 may invoke one or more circuit optimizers to optimize the revised circuit design. For example, in one embodiment a user may specify control parameters specifying one or more of a maximum area, a maximum time response, a minimum frequency response, a maximum power requirement, and a maximum heat dissipation for the circuit design. Controller 122 may repeatedly, e.g., iteratively, or recursively, invoke one or more of power/heat optimizing unit 134, area optimizing unit 136, routing optimizing unit 138 and time/frequency optimizing unit 140 until the integrated circuit design characteristics are within the predetermine target for each integrated circuit characteristic. In another embodiment, controller 122 may be configured to optimize the revised circuit design with respect to the same parameters used to select the processing path. For example, if a processing path was selected for having the largest layout area requirements, controller 122 may first invoke area optimizing unit 136 to optimize the revised circuit with respect to area, before invoking other optimizers. Further, if the processing path was selected based on a combination of criteria, controller 122 may first invoke optimizing units to optimize the revised circuit with respect to each criteria used to select the processing path, before invoking other optimizers. In this manner, the revised circuit is optimized with respect to the circuit characteristics that the user wishes to improve. Once the integrated circuit design has been optimized in accordance with the established control parameters, operation of the method continues to step S410.

In this manner, operation of the method continues until controller 122 determines, at a subsequent iteration of step S411, described above, that no processing paths were selected in step S410, at which time operation of the method proceeds to step S422 and the process terminates.

Figure 5:
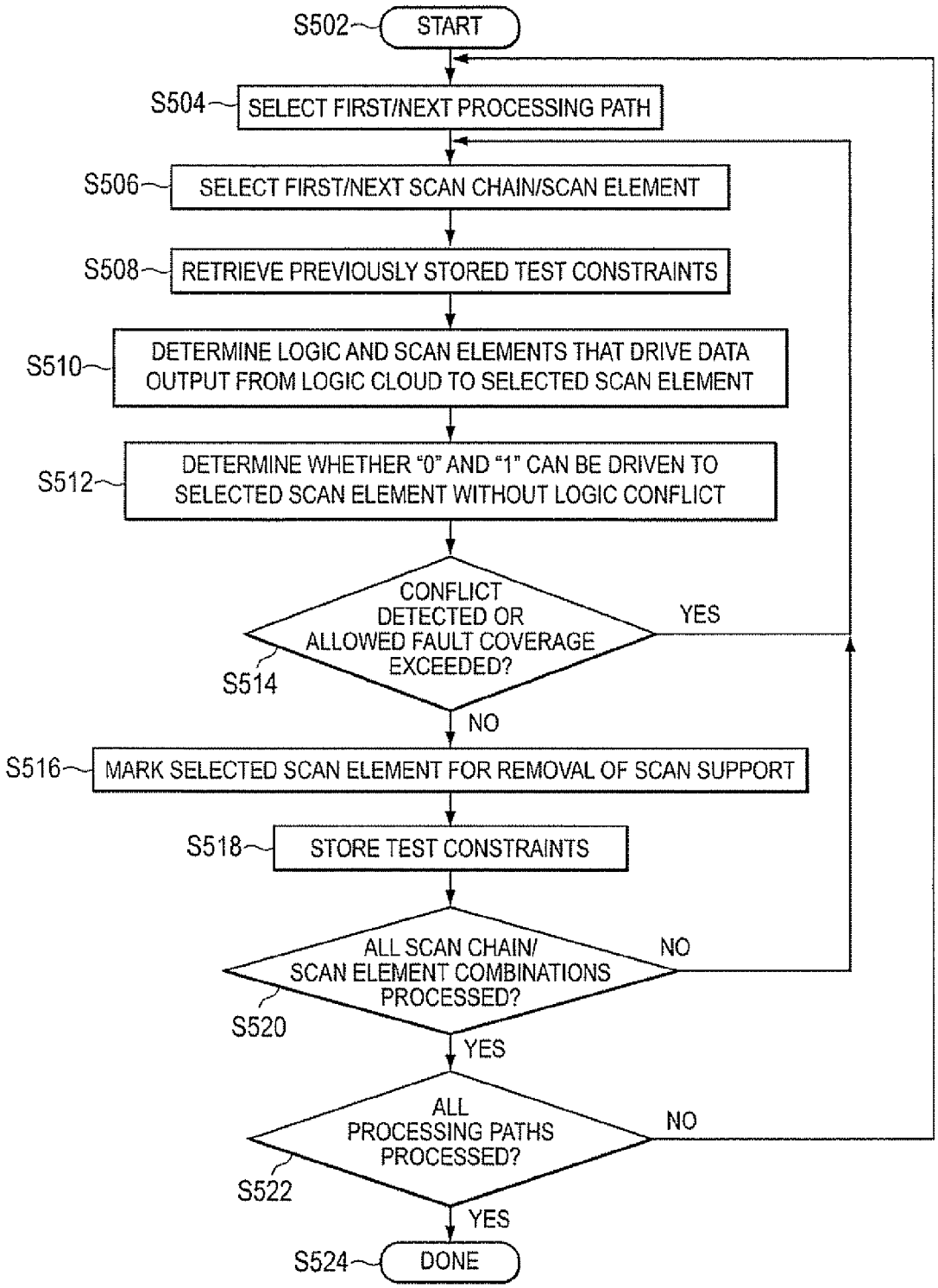
FIG. 5 is a flow diagram representing an example of a method for identifying redundant scan elements within an integrated circuit design.

FIG. 5 is a flow diagram representing an example of a method for identifying redundant scan elements within an integrated circuit design. For example, the process flow may be executed by redundant scan element identifying unit 204 to assess selected processing paths for redundant scan elements as part of the process flow described above with respect to FIG. 4, at step S412. As shown in FIG. 5, operation of the method begins at step S502 and proceeds to step S504.

In step S504, redundant scan element identifying unit 204 may select a first, or next, processing path from a set of one or more processing paths selected by processing path selection unit 128, as described above with respect to FIG. 4, step S410. The selected processing path may include one or more scan chains. The respective scan chains may be configured to operate in parallel or in sequence as described below in greater detail with respect to FIGS. 6-9. Once a processing path, and associated scan chains have been selected, operation of the method continues to step S506.

In step S506, a first, or next scan element, e.g., a scan-enabled flip-flop or other suitable memory element, in one of the selected scan chains is selected, and operation of the method continues to step S508.

In step S508, constraints stored, as addressed in greater detail with respect to step S518, below, in association with the selected scan element may be retrieved from memory, and operation of the method continues to step S510.

In step S510, source logic identifying unit 208 and source data identifying unit 210 may assess the currently selected integrated circuit design to identify the source of a binary value stored in the currently selected scan element. For example, if the selected scan element receives output from a combinational logic as a result of a capture, redundant scan element identifying unit 204, via source logic identifying unit 208 and source data identifying unit 210, may identify the combinational logic that drives the generated output, and may identify the memory elements that provide input to the identified combinational logic. Further, redundant scan element identifying unit 204 may, via source data identifying unit 210, identify the scan element that provides binary data to the selected scan element in scan-shift mode. Once the integrated circuit design has been analyzed, and such information collected, operation of the method continues to step S512.

In step S512, redundant scan element identifying unit 204 may determine, via logic flow identifying unit 212, whether a binary "0" and a binary "1" can be driven to the selected scan-enable element via the combinational logic without conflict and may determine via verifying unit 216 that removal of the scan element, i.e., conversion of the scan element to a non-scannable memory element would result in a decrease in fault coverage that would exceed the allowed fault coverage reduction threshold described above with respect to step S405.

To assess whether a binary value captured in the currently selected scan element can be independently driven by other scan elements via a combinational logic, redundant scan element identifying unit 204 may assess test constraints stored in association with the respective scan-enabled memory elements as a result of previously executed iterations of the process flow, as described with respect to step S518 below. For example, if the currently selected scan-enabled memory element has been designated, in previously executed iterations of the process flow, to control the binary data provided to a memory element previously removed from a scan chain, a conflict may be found to exist. The conflict may be based on the fact that the currently selected scan-enabled memory element must remain scan-enabled so that it may be used to drive a value for capture to a memory element that is not scan-enabled.

Redundant scan element identifying unit 204 may determine that a conflict does not exist if it can determine an approach to independently drive the value captured by the currently selected scan-enabled memory element to either a "0" or a "1" that does not mutually exclude another memory element from being independently driven to either a "0" or a "1." The approach used to independently drive the value captured by the currently selected scan element to either a "0" or a "1" may include any combination of sequential flow scan-shifts and launch events. Once the integrated circuit has been assessed to determine whether a binary "0" and a binary "1" can be driven to the selected scan-enable element via the combinational logic without conflict, operation of the method continues to step S514.

If, in step S514, a conflict has been detected or a determined reduction in fault coverage is found to exceed an allowed predetermine, and/or user defined, allowed fault coverage reduction threshold, operation of the method returns to step S506, otherwise operation of the method continues to step S516.

In step S516, the selected scan element is marked for conversion to a memory element that is not scan-enabled, e.g., marked for conversion from a scan-enabled flip-flop to a flip-flop that does not support scan testing, and operation of the method continues to step S518.

In step S518, constraints, or interdependencies, on or between other scan elements related to conversion of the selected scan element to a non-scan-enabled memory element may be stored. Such constraints may be considered in determining whether a conflict exists in considering whether to convert subsequent scan elements to non-scan-enabled memory elements, for example, as described above with respect to step S512. For example, stored constrains may include constraints related to which scan elements may be used to control the binary value captured on the selected scan element during a launch cycle and the values that may be loaded to the respective driving scan elements in order for the selected memory element to capture one of a "0" and a "1" during a launch cycle. Such constraints may be used to support the generation of automated test patterns that may be use to test the optimized circuit. Once constraints, or interdependencies, on or between other scan elements related to conversion of the selected scan element to a non-scan-enabled memory element have been stored, operation of the method continues to step S520.

If, in step S520, the controller determines that all scan-enabled memory elements in the currently selected scan chain have been processed, operation of the method continues to step S522, otherwise, operation of the method returns to step S506.

If, in step S522, the controller determines that all scan chains in the selected processing path have been processed, operation of the method continues to step S524 and the process terminates, otherwise, operation of the method returns to step S504.

Assuming that the process described above is executed at step S412, within iterations of the process flow described above with respect to FIG. 4, processing may proceed to step S414.

Figure 6:
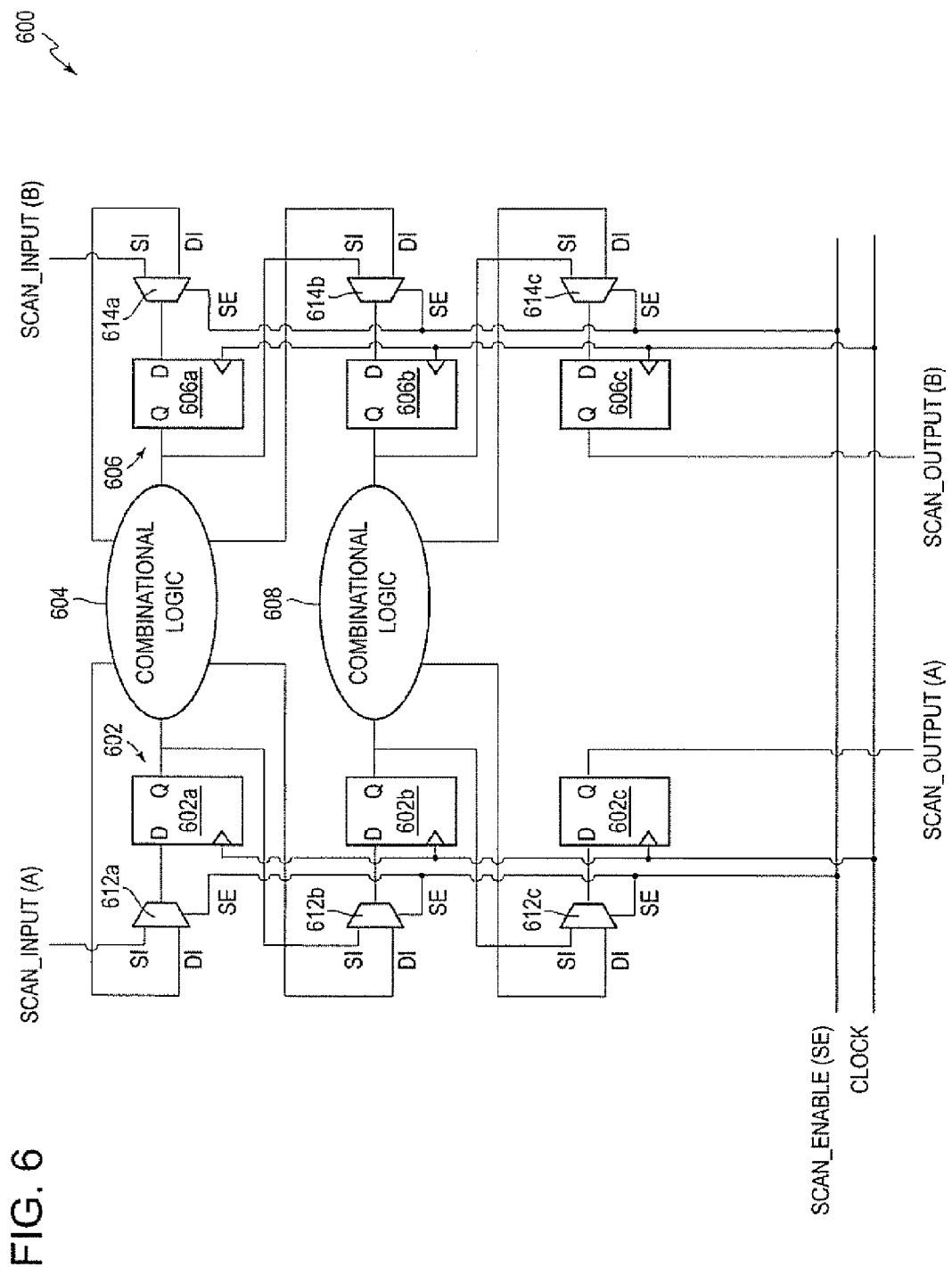
FIG. 6 is a schematic diagram of a portion of a first semiconductor integrated circuit with scan flip-flops than have not been assessed for redundancy.

FIG. 6 is a schematic diagram of an example of a portion of an integrated circuit, or processing path, 600 that may be included within an integrated circuit design. As shown in FIG. 6, processing path 600 may include a first bank of flip-flops 602, a first combinational logic 604, a second bank of flip-flops 606, and a second combinational logic 608. First bank of flip-flops 602 may include 3 flip-flops, each labeled 602*a*, 602*b* and 602*c*, respectively; and second bank of flip-flops 606 may include 3 flip-flops, each labeled 606*a*, 606*b* and 606*c*, respectively. Each flip-flop in the respective first and second flip-flop banks may include a data_input lead, D, a data output lead, Q, and a clock input lead that is connected to a common clock source.

Combinational logic 604 and combinational logic 608 maybe any combination of binary combinational logic and may include any combination of binary logic processing circuits, e.g. AND, NAND, OR, NOR, XOR, etc., and/or any combination other binary logic processing circuits capable of producing one or more binary logic output values, e.g., HIGH or LOW, as a result of receiving one or more binary input values, e.g., HIGH or LOW.

In operation, with each clock pulse, each flip-flop may receive and may store via its data_input lead a binary value, e.g., either a HIGH voltage signal representing a binary "1" or a LOW voltage signal representing a binary "0" and transmits, via its data_output lead, the binary value previously received and stored in response to the previous clock pulse. Therefore, with every clock pulse, each flip-flop in bank of flip-flops 602 and bank of flip-flops 606 may receive and store, via their respective data_input leads, a binary value from the respective separate data input sources and may transmit via their respective data_output leads, a binary value that was received and stored in response to the previous clock pulse.

Processing path 600 includes two parallel scan chains. Each scan chain includes a scan input lead, labeled in FIG. 6 as scan_input(A) and scan_input(B), respectively, and a scan output lead, labeled in FIG. 6 as scan_output(A) and scan_output(B), respectively. Each scan chain may be controlled to support any combination of scan-shift, launch and capture operations thereby allowing processing path 600 to be tested using sequential flow scan test techniques.

As shown in FIG. 6, each flip-flop has been modified so that each flip-flop may be included in one of the two scan chains. For example, each flip-flop has been modified to include a scan control element, e.g., a multiplexor, that allows each flip-flop to receive via its respective data_input lead one of: (1) a scan input binary value transmitted from a preceding flip-flop in the scan chain; and (2) a data input binary value received from a data source, e.g. an external data lead, or, as shown in FIG. 6, a combinational logic circuit. A scan enable control signal, scan_enable, connected to a control lead, SE, on each multiplexor may be used to control which binary value is received by the respective multiplexors.

It is noted that the processing path shown in FIG. 6 may be a portion of an integrated circuit that may include many processing paths, not shown in FIG. 6, arranged in parallel with and/or in series with the processing path shown in FIG. 6. One or more of the data_input leads of one or more of these other processing paths may be connected to receive input from external data sources. Further, it is noted that introduction of a multiplexor to each flip-flop, as depicted in the FIG. 6, is one example of a technique that may be used to allow each flip-flop to support scan testing. The circuit, shown in FIG. 6 may be modified in other ways, e.g., with the introduction of another type of scan control element per flip-flop, or the introduction of some other type of scan-enabled memory element, in order to enable scan testing. The result of each approach, however, is to allow one or more of the respective flip-flops to: (1) switch for one or more clock pulses, or cycles, from a normal operation mode, to a scan chain test load mode in which scan chain test binary values may be sequentially loaded from one or more scan chain input sources into one or more of the respective flip-flops via a scan chain; (2) switch from the scan chain test load mode back to normal operation for one or more clock cycles, so that the combinational logic matrices may process the loaded test data and the results of the respective combinational logic matrices captured on the respective flip-flops; and (3) switch back to the scan chain test load mode so that the captured values may be sequentially unloaded from the one or more capturing flip-flops in the scan chain via one or more scan chain output sinks.

As addressed above, regardless of the components added to an integrated circuit to support scan chain testing, the added components increase area requirements and increase the number of control lines that must be routed. Further, such additional features and routing increase the minimum clock cycle time and increase power consumption requirement, thereby decreasing the maximum frequency that may be achieved by the circuit and increasing heat dissipation requirements. For example, adapting the circuit to support scan testing significantly increases the complexity of the circuit by requiring the inclusion of external scan input leads, the inclusion of external scan output leads, the inclusion of a scan enable lead, the inclusion of, for example, a multiplexor for each flip-flop, and the routing of additional control lead and data lead connections. Such additional components and leads adversely affect, i.e., increase, the area, timing, routing, power consumption and heat dissipation requirements of the circuit.

The integrated circuit described above with respect to FIG. 6 may be referred to as a full-scan circuit. Full scan is a scan design methodology that replaces all memory elements, e.g., flip-flops, in the design with their scan-enabled equivalents, e.g., multiplexed flip-flops, and then connects them into one or more scan chains. The approach is to control and observe the values in all the storage elements in a chip design so that test generation and fault simulation tasks for the chip are simplified.

As shown in FIG. 6, scan-enabled memory element 602b may be connected to scan-enabled memory element 602a in scan-shift mode and may capture data driven by combinational logic 604 in launch/capture mode. Therefore, assuming scan-enabled memory element 602a and scan-enabled memory element 606a, which influence combinational logic 604 but have no influence on combinational logic 608, can be loaded with data such that scan-enabled memory element 602b will be able to capture a binary "0" and a binary "1" values then scan-enabled memory element 602b may be excluded from the scan insertion memory elements list, and may remain a memory element that is not scan-enabled in the final integrated circuit design.

Figure 7:
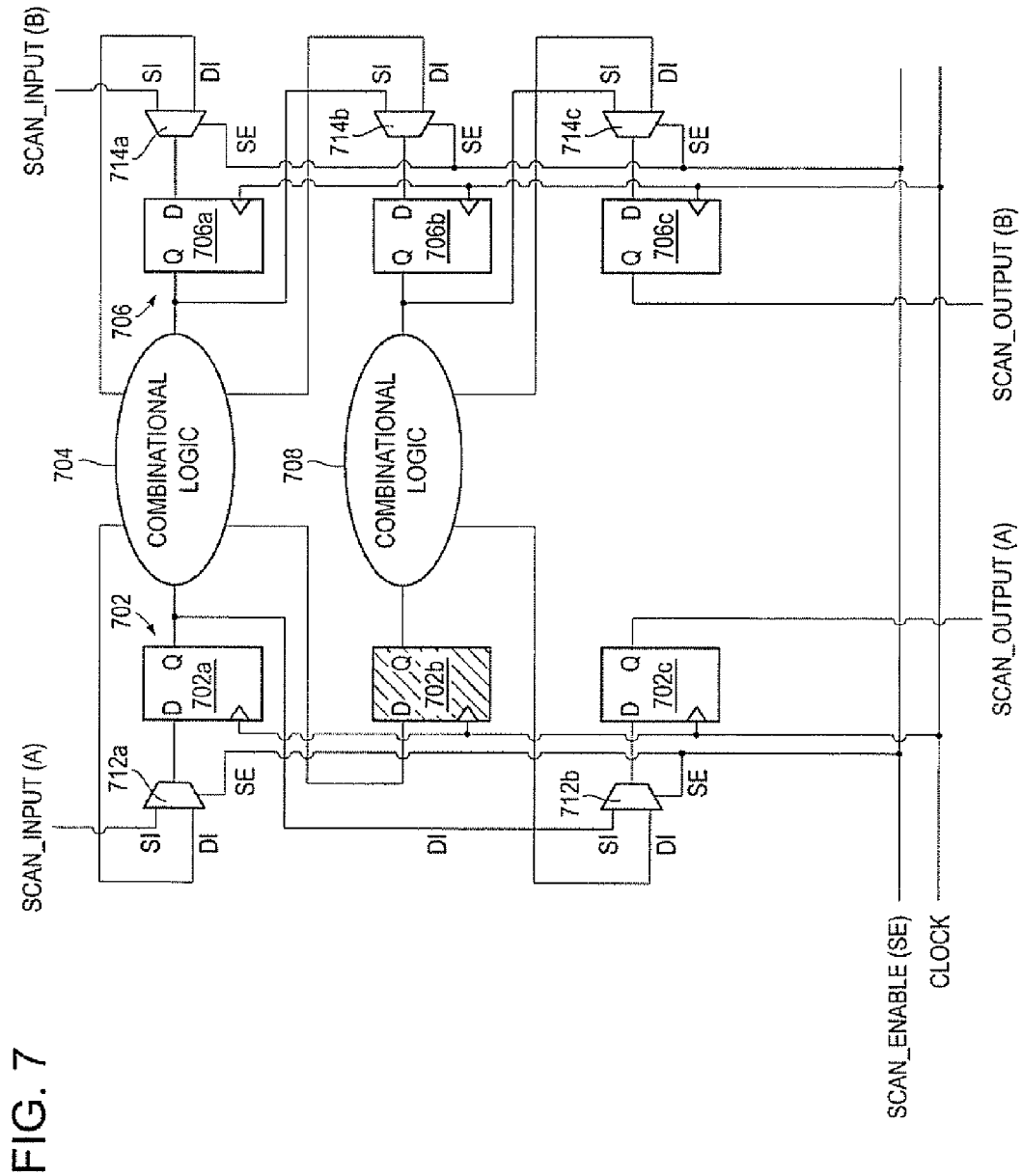
FIG. 7 is a schematic diagram of the portion of the first semiconductor integrated circuit shown in FIG. 6, with redundant scan flip-flops removed.

FIG. 7 presents the same processing path shown in FIG. 6, after the process flows described above with respect to FIG. 4 and FIG. 5 have been executed. As described above with respect to FIG. 6, if, based on an analysis of the described circuit configuration and underlying combinational logic, as described above with respect to FIG. 5, redundant scan element identifying unit 204 determines that using a sequential flow scan testing process, scan-enabled memory element 602b may capture a binary "0" and a binary "1" values, then scan-enabled memory element 602b may be converted to a memory element that is not scan-enabled in the final integrated circuit design. Nevertheless, in a sequential flow scan test environment, the circuit design shown in FIG. 7 may support the same number of test patterns through the combination logic matrices as the circuit could support prior to the scan element being replaced with a memory element that does not support scan testing. Therefore, the circuit shown in FIG. 7, despite the use of fewer components and fewer leads, is able to provide the same level of fault coverage.

Figure 8:
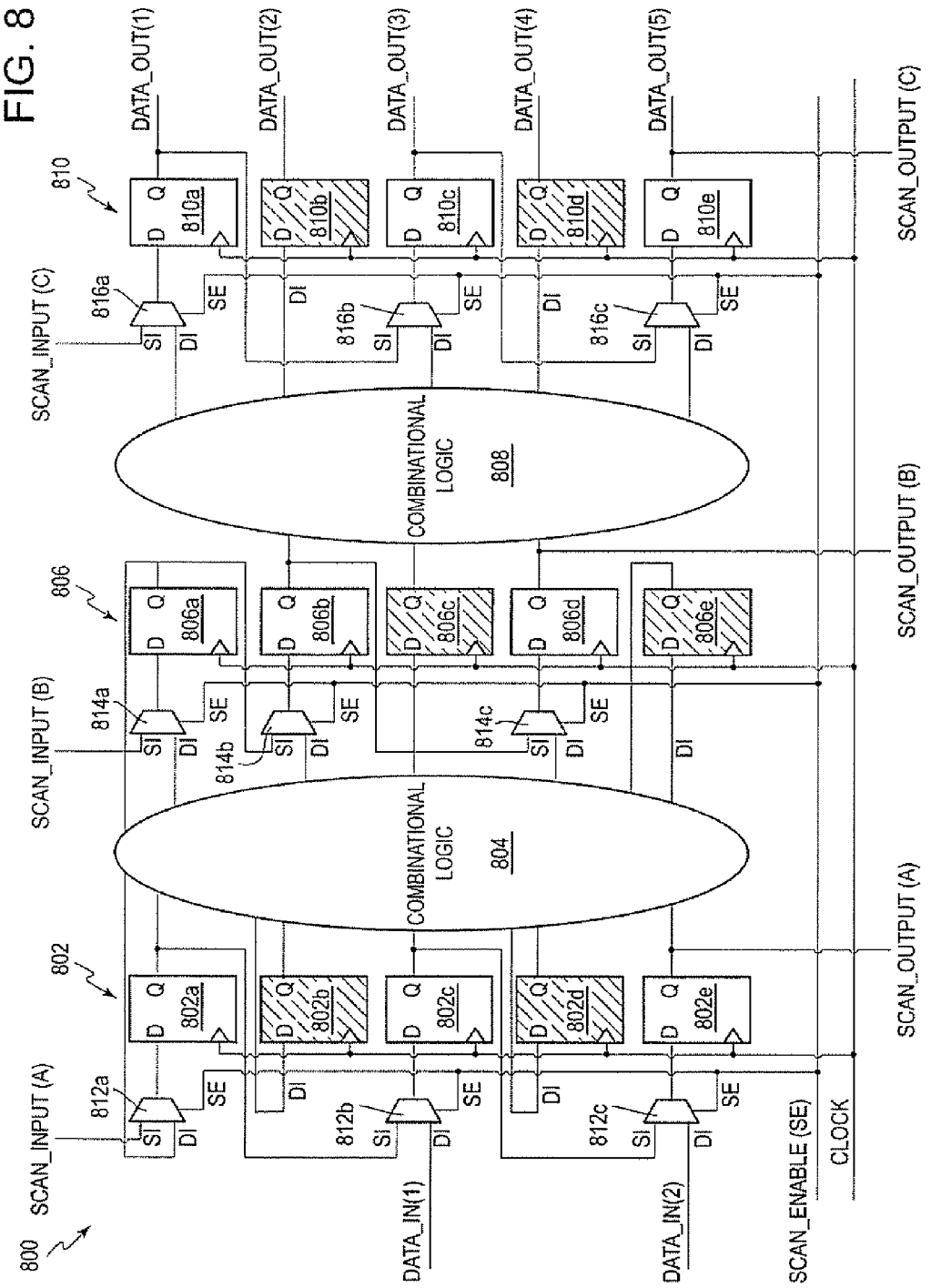
FIG. 8 is a schematic diagram of the portion of a second semiconductor integrated circuit with redundant scan flip-flops removed.

FIG. 8 is a schematic diagram of an example of a processing path 800 within an example of an integrated circuit design. Processing path 800 includes three parallel scan chains. Features in processing path 800 corresponding to like features described above with respect to FIG. 6 and FIG. 7 are identified with similar numbers. For example, first bank of flip-flops 802, first combinational logic 804, second bank of flip-flops 806, second combinational logic 808, and third bank of flip-flops 810, are identified with labels in which the last two digits correspond with the last two digits of labels used to identify similar features within FIG. 6 and FIG. 7, described above, and therefore, these features will not be further addressed with respect to FIG. 8.

FIG. 8 presents an example of an optimized processing path, with reduced components and routed connections, which may be generated as a result of applying the process flows described above with respect to FIG. 4 and FIG. 5. For example, as a result of the process flow described above with respect to FIG. 5, redundant scan element identifying unit 204 may have determined that, using a sequential flow scan testing process, six scan-enabled flip-flops were capable of being loaded with one of a binary "0" and a binary "1" values via the combinational logic. As a result, the memory element 802b, memory element 802d, memory element 806c memory element 806e, memory element 810b, memory element 810d, have been converted from scan-enabled memory elements to memory element that are not scan-enabled, thereby reducing the total number of components and routed connections within the circuit. Nevertheless, in a sequential flow scan test environment, the circuit design shown in FIG. 8 is able to support the same number of test patterns through the combination logic matrices as the circuit could support prior to the redundant scan-enabled memory element being replaced with memory elements that do not support scan testing. Therefore, the circuit shown in FIG. 8, despite the use of fewer components and fewer leads, is able to provide the same level of fault coverage.

Figure 9:
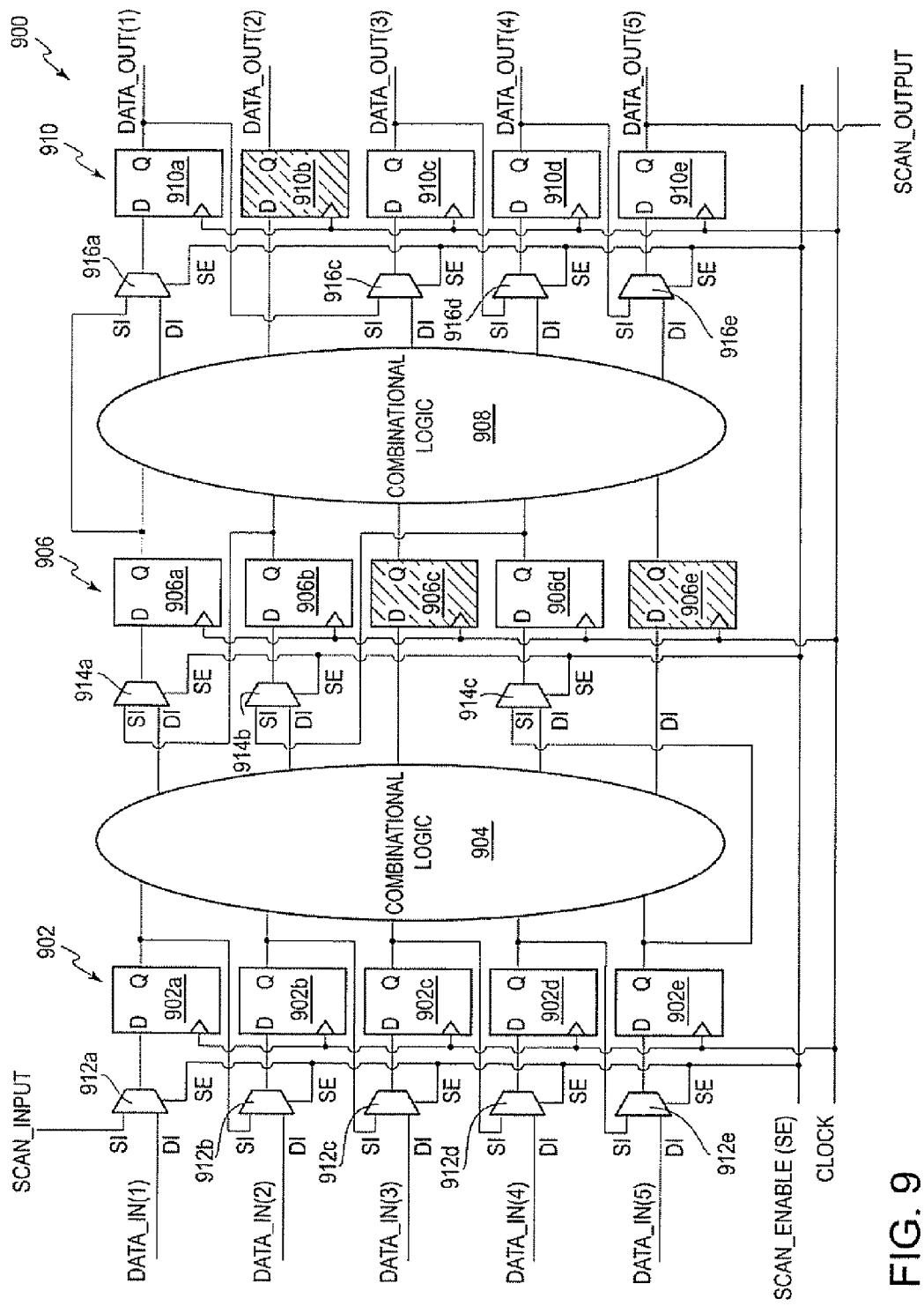
FIG. 9 is a schematic diagram of the portion of a third semiconductor integrated circuit with redundant scan flip-flops removed.

FIG. 9 is a schematic diagram of an example of an processing path 900 within an example of an integrated circuit design. Processing path 900 includes a single scan chain. Features in processing path 900 corresponding to like features described above with respect to FIG. 6 and FIG. 7 are identified with similar numbers. For example, first bank of flip-flops 902, first combinational logic 904, second bank of flip-flops 906, second combinational logic 908, and third bank of flip-flops 910, are identified with labels in which the last two digits correspond with the last two digits of labels used to identify similar features within FIG. 6 and FIG. 7, described above, and therefore, these features will not be further addressed with respect to FIG. 9.

FIG. 9 presents an example of an optimized integrated circuit, with reduced components and routed connections, which may be generated as a result of applying the process flows described above with respect to FIG. 4 and FIG. 5. As a result of the process flow described above with respect to FIG. 5, redundant scan element identifying unit 204 may have determined that, using a sequential flow scan testing process, three scan-enabled flip-flops were capable of capturing binary "0" and a binary "1" values. As a result, the memory element 906c, memory element 906e, and memory element 910b, have been converted from scan-enabled memory elements to memory element that are not scan-enabled, thereby reducing the total number of components and routed connections within the circuit. Nevertheless, in a sequential flow scan test environment, the circuit design shown in FIG. 9 is able to support the same number of test patterns through the combination logic matrices as the circuit could support prior to scan-enabled memory element being replaced with a memory element that does not support scan testing. Therefore, the circuit shown in FIG. 9, despite the use of fewer components and fewer leads, is able to provide the same level of fault coverage.

It is to be understood that the various functions that support the described approach for producing optimized integrated circuit designs may be distributed in any manner among any quantity (e.g., one or more) of hardware and/or software modules or units that may be interconnected with circuitry and/or software interfaces.

The functions that support the described approach for producing optimized integrated circuit designs may include any commercially available operating system (e.g., Windows, OS/2, Unix, Linux, DOS, etc.), any commercially available and/or custom software (e.g., communication software, etc.) and any types of input/output devices (e.g., keyboard, mouse, probes, I/O port, etc.).

Software, or firmware, that support the described approach for producing optimized integrated circuit designs may be implemented in any desired computer language, and may be developed by one of ordinary skill in the computer and/or programming arts based on the functional description contained herein and illustrated in the drawings. For example, in one example of an embodiment the described device may be written using the C++ programming language or the JAVA programming language. However, the present invention is not limited to being implemented in any specific programming language or combination of programming languages.

Any software associated with the described approach for producing optimized integrated circuit designs may be distributed via any suitable media (e.g., removable memory cards, CD-ROM, tape or other storage media diskette, ad-hoc network connection). Software and/or default control parameters may be installed in any manner (e.g., an install program, copying files, entering an execute command, etc.).

The described approach for producing optimized integrated circuit designs may accommodate any quantity and any type of data sets in any desired format (e.g., ASCII, plain text, or other format, etc.). The format and structure of internal information structures used to hold intermediate information in support of the described approach for producing optimized integrated circuit designs may include, but are not limited to files, arrays, matrices, status and control booleans/variables.

Further, any references herein to software performing various functions generally refer to computer systems or processors performing those functions under software control. The computer system may alternatively be implemented by hardware or other processing circuitry.

Flip-flop based memory elements and multiplexed flip-flop based scan-enabled memory elements are but examples of memory elements and scan elements. The approach described above may be used to identify redundant scan elements and to replace redundant scan elements with memory elements that are not scan-enabled, regardless of the technology used to implement the respective scan elements and memory elements.

In integrated circuit designs optimized using the described approach, the scan chains may be driven by the same and/or different clocks, thereby allowing the respective sequential flow scan-shift, launch, and capture operations to be performed in a synchronous, or asynchronous manner. Timing with respect sequential flow operations performed by scan chains controlled by separate clocks may be controlled via the controller to load and execute the respective test patterns.

From the foregoing description, it will be appreciated that an approach and integrated circuit electronic design device that supports the production of optimized integrated circuit designs is disclosed. The described approach is capable of generating integrated circuit designs with a reduced total area layout and complexity, an improved time/frequency response, and/or minimize power consumption and/or heat generation, without reducing the fault coverage achieve during testing.

For purposes of explanation, in the above description, numerous specific details are set forth in order to provide a thorough understanding of the described integrated circuit electronic design device and the described approach for producing optimized integrated circuit designs that support partial scan testing. It will be apparent, however, to one skilled in the art that the described approach for producing optimized integrated circuit designs that support partial scan testing may be practiced without these specific details. In other instances, well-known structures and devices are shown in block diagram form in order to avoid obscuring the features of the described approach for producing optimized integrated circuit designs that support partial scan testing.

While the described approach for producing optimized integrated circuit designs that support partial scan testing has been described in conjunction with the specific embodiments thereof, it is evident that many alternatives, modifications, and variations will be apparent to those skilled in the art. Accordingly, embodiments of the described approach for producing optimized integrated circuit designs that support partial scan testing as set forth herein are intended to be illustrative, not limiting. There are changes that may be made without departing from the spirit and scope of the invention.

What is claimed is:

1. A method of configuring an integrated circuit design to support sequential flow partial scan testing, comprising:

providing a plurality of memory elements in the integrated circuit design that are scannable memory elements by a computer, wherein the integrated circuit design has a specified scan coverage selecting one or more processing paths within the integrated circuit design that exceed a feature threshold for one or more characteristics based on a first selection criteria;

identifying at least one of the scannable memory elements in the selected one or more processing paths criteria as being a redundant scan element that does not alter the scan coverage in excess of a fault coverage reduction threshold, wherein the selected one or more processing paths include one or more scan chains, wherein one of the scannable memory elements is identified as the redundant scan element when another scannable memory element can independently drive via combinational logic a binary value captured in the redundant scan element;

converting the identified redundant scan element to memory element that is not scannable in a revised integrated circuit design; and optimizing a parameter of the revised integrated circuit design.

2. The method of claim 1, further comprising:

using a second selection criteria to identify at least one of the scannable memory elements in the revised integrated circuit design as being another redundant scan element that does not alter the scan coverage in excess of the fault coverage reduction threshold;

converting the identified redundant scan elements in a newly revised integrated circuit design to memory elements that are not scannable; and optimizing a parameter of the newly revised integrated circuit design.

3. The method of claim 2, further comprising:

generating a measure of incremental improvement for the newly optimized revised integrated circuit design based on a previously optimized revised integrated circuit design; and repeating the steps of identifying, converting and optimizing until the measure of incremental improvement is below an incremental improvement threshold.

4. The method of claim 1, wherein selecting the processing path further comprises:

selecting a processing path within the integrated circuit design with a characteristic that exceeds a feature threshold, wherein the feature threshold is one of:

a maximum layout area of the processing path;

a maximum timing delay of the processing path;

a minimum operational frequency of the processing path;

a maximum combined length of routing leads within the processing path;

a maximum power consumption of the processing path; and a maximum heat dissipation of the processing path.

5. The method of claim 1, wherein at least one redundant scan element includes a scan control element, and the step of converting a redundant scan control element to a memory element that is not scannable, further comprises:

removing the scan control element from the redundant scan element.

6. The method of claim 1, wherein identifying redundant scan elements further comprises:
  locating combinational logic in the integrated circuit design that provides input values to a scan element;
  locating circuit components in the integrated circuit design that supply input values to the located combinational logic; and
  determining a sequential flow that allows each of a high logic value and a low logic value to be stored in the scan element.

7. The method of claim 6, wherein identifying redundant scan elements further comprises:
  storing operational constraints related to the sequential flow that allows each of a high logic value and a low logic value to be stored in the scan element.

8. The method of claim 6, further comprising:
  verifying that the sequential flow used to store either a high logic value and a low logic value to the scan element does not reduce a fault coverage that is achieved below a fault coverage reduction threshold.

9. The method of claim 1, wherein identifying redundant scan elements further comprises:
  determining a first fault coverage for the circuit with a selected scan element;
  determining a second fault coverage for the circuit assuming that the selected scan element is converted to a non-scannable memory element; and
  identifying the selected scan element as redundant if a difference between the first fault coverage and the second fault coverage does not exceed a fault coverage reduction threshold, and
  wherein the selected scan element is not identified as redundant if a difference between the first fault coverage and the second fault coverage exceeds the fault coverage reduction threshold.

10. An integrated circuit electronic design device, comprising:
  an insertion unit that provides a plurality of memory elements in the integrated circuit design that are scannable memory elements, wherein the integrated circuit design has a specified scan coverage; a processing path unit that selects one or more processing paths within the integrated circuit design that exceed a feature threshold for one or more characteristics based on a first selection criteria;
  a redundancy unit that identifies at least one of the scannable memory elements in the selected one or more processing paths as being a redundant scan element that does not reduce the scan coverage in excess of a fault coverage reduction threshold, wherein the selected one or more processing paths include one or more scan chains, wherein one of the scannable memory elements is identified as the redundant scan element when another scannable memory element can independently drive via combinational logic a binary value captured in the redundant scan element;
  a conversion unit that converts the identified redundant scan element to memory element that is not scannable in a revised integrated circuit design; and
  one or more optimizer units that optimize a parameter of the revised integrated circuit design.

11. The integrated circuit electronic design device of claim 10, further comprising:
  a controller that compares features of the optimized revised integrated circuit design to features of a previously optimized revised integrated circuit design to generate a measure of incremental improvement,
  wherein the controller controls the redundancy unit, the conversion unit, and the one or more optimizer units to generate a next optimized revised integrated circuit design based on the optimized revised integrated circuit design until the measure of incremental improvement is below an incremental improvement threshold.

12. The device of claim 10, wherein redundant scan elements include a scan control element, and wherein the conversion unit further comprises:
  a deletion unit that converts redundant scan elements to memory elements that are not scannable by removing the scan control elements from the redundant scan elements.

13. The device of claim 10, wherein the redundancy unit further comprises:
  a logic identifying unit that locates combinational logic in the integrated circuit design that provides input values to a scan element;
  a data identifying unit that locates circuit components in the integrated circuit design that supply input values to the located combinational logic; and
  a flow identifying unit that determines a sequential flow that allows each of a high logic value and a low logic value to be stored in the scan element.

14. The device of claim 10, further comprising:
  a fault coverage unit that determines a first fault coverage for the circuit with a selected scan element, determines a second fault coverage for the circuit assuming that the selected scan element is converted to a non-scannable memory element,
  wherein a selected scan element is not identified as redundant if a difference between the first fault coverage and the second fault coverage exceeds the fault coverage reduction threshold.

15. An integrated circuit manufactured from an integrated circuit design produced using an integrated circuit electronic design device, comprising:
  an insertion unit that provides a plurality of memory elements in the integrated circuit design that are scannable memory elements, wherein the integrated circuit design has a specified scan coverage; a selection unit that selects one or more processing paths within the integrated circuit design that exceed a feature threshold for one or more characteristics based on a first selection criteria;
  a redundancy unit that identifies at least one of the scannable memory elements in the selected one or more processing paths as being a redundant scan element that does not alter the scan coverage in excess of a fault coverage reduction threshold, wherein the selected one or more processing paths include one or more scan chains, wherein one of the scannable memory elements is identified as the redundant scan element when another scannable memory element can independently drive via combinational logic a binary value captured in the redundant scan element;
  a conversion unit that converts the identified redundant scan element to a memory element that is not scannable in a revised integrated circuit design; and
  one or more optimizer units that optimize a parameter of the revised integrated circuit design.

16. The integrated circuit of claim 15, the integrated circuit electronic design device used in the production of the integrated circuit, further comprising:

a controller that generates a measure of incremental improvement for the optimized revised integrated circuit design based on a previously optimized revised integrated circuit design, wherein the controller controls the redundancy unit, the conversion unit, and the one or more optimizer units to generate a next optimized revised integrated circuit design based on the optimized revised integrated circuit design until the measure of incremental improvement is below an incremental improvement threshold.

17. The integrated circuit of claim 15, the integrated circuit electronic design device used in the production of the integrated circuit, further comprising:

a deletion unit that converts redundant scan elements in an integrated circuit design to memory elements that are not scannable by removing scan control elements from the redundant scan elements.

18. The integrated circuit of claim 15, the integrated circuit electronic design device used in the production of the integrated circuit, further comprising:

a fault coverage unit that determines a first fault coverage for an integrated circuit design with a selected scan element, determines a second fault coverage for the circuit design assuming that the selected scan element is converted to a non-scannable memory element, and that determines whether a difference between the first fault coverage and the second fault coverage exceeds a fault coverage reduction threshold.

* * * * *